US010206288B2

(12) United States Patent
Mei et al.

(10) Patent No.: US 10,206,288 B2
(45) Date of Patent: Feb. 12, 2019

(54) BARE DIE INTEGRATION WITH PRINTED COMPONENTS ON FLEXIBLE SUBSTRATE

(71) Applicant: Palo Alto Research Center Incorporated, Palo Alto, CA (US)

(72) Inventors: Ping Mei, San Jose, CA (US); Gregory L. Whiting, Menlo Park, CA (US); Brent S. Krusor, Fremont, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 305 days.

(21) Appl. No.: 14/964,964

(22) Filed: Dec. 10, 2015

(65) Prior Publication Data

US 2017/0048986 A1    Feb. 16, 2017

Related U.S. Application Data

(60) Provisional application No. 62/204,706, filed on Aug. 13, 2015.

(51) Int. Cl.
*H05K 1/02* (2006.01)
*H05K 3/30* (2006.01)
(Continued)

(52) U.S. Cl.
CPC ........... *H05K 3/306* (2013.01); *H01L 21/568* (2013.01); *H01L 21/6835* (2013.01);
(Continued)

(58) Field of Classification Search
CPC ... H01L 21/568; H01L 21/6835; H01L 23/13; H01L 23/49838; H01L 24/24;
(Continued)

(56) References Cited

U.S. PATENT DOCUMENTS 4,658,330 A * 4/1987 Berg ............... H05K 3/325
                                                 361/720
4,731,645 A * 3/1988 Parmentier ...... G06K 19/07745
                                                 235/380
(Continued)

FOREIGN PATENT DOCUMENTS

CN     1 0451 791 1 A      4/2015
DE     10 2013 201 926 A1  8/2014
EP     2 639 278 A1        9/2013

OTHER PUBLICATIONS

Fjelstad, "Solderless Assembly of Electronic Products—a More Reliable and More Cost Effective Approach to Electronics Manufacturing?", Vehicle Power and Propulsion Conference, 2009. VPPC '09., IEEE, 7 pgs.

(Continued)

*Primary Examiner* — Minh Trinh
(74) *Attorney, Agent, or Firm* — Fay Sharpe LLP (57) ABSTRACT

A hybrid electronic assembly includes a substrate having conductive circuit tracings, and includes at least one opening defined within length and width dimensions of the substrate. An electronic circuit component which has conductive circuit tracings, and is located within the at least one opening of the substrate. An alignment area where a first surface of the substrate and a first surface of the electronic circuit component are aligned in a substantially planar flat relationship with the electronic circuit component. A non-alignment area where a second surface of the substrate and a second surface of the electronic circuit component are in a non-aligned relationship. A bonding material formed on at least a portion of the second surface of the substrate and on at least a portion of the electronic circuit component and where conductive traces are formed between the first surface of the substrate and the first surface of the electronic circuit com- (Continued)

ponent, providing electrical connections between the substrate and the electronic circuit component.

11 Claims, 6 Drawing Sheets

(51) Int. Cl.

| | |
|---|---|
| *H01L 23/13* | (2006.01) |
| *H01L 23/498* | (2006.01) |
| *H01L 23/00* | (2006.01) |
| *H01L 21/683* | (2006.01) |
| *H05K 3/28* | (2006.01) |
| *H05K 3/00* | (2006.01) |
| *H05K 3/12* | (2006.01) |
| *H01L 21/56* | (2006.01) |
| *H05K 1/18* | (2006.01) |

(52) U.S. Cl.
CPC ........ *H01L 23/13* (2013.01); *H01L 23/49838* (2013.01); *H01L 24/24* (2013.01); *H01L 24/82* (2013.01); *H05K 1/184* (2013.01); *H05K 3/0017* (2013.01); *H05K 3/0026* (2013.01); *H05K 3/0044* (2013.01); *H05K 3/125* (2013.01); *H05K 3/1275* (2013.01); *H05K 3/284* (2013.01); *H05K 3/305* (2013.01); *H05K 1/183* (2013.01); *H05K 2201/0133* (2013.01); *H05K 2203/1327* (2013.01); *Y02P 70/613* (2015.11)

(58) Field of Classification Search
CPC ........ H01L 24/82; H05K 1/183; H05K 1/184; H05K 2201/0133
See application file for complete search history.

(56) References Cited

U.S. PATENT DOCUMENTS

| | | | |
|---|---|---|---|
| 5,976,912 A | 11/1999 | Fukutomi | |
| 6,815,251 B1 * | 11/2004 | Akram | ................. H01L 23/5386 257/678 |
| 2002/0153832 A1 | 10/2002 | Yanagisawa et al. | |
| 2006/0258044 A1 | 11/2006 | Meyer et al. | |
| 2007/0183273 A1 | 8/2007 | Arai | |
| 2009/0056997 A1 * | 3/2009 | Fjelstad | ................. H05K 1/185 174/261 |
| 2010/0013076 A1 | 1/2010 | Jang et al. | |
| 2012/0008287 A1 | 1/2012 | Kim et al. | |
| 2012/0049388 A1 | 3/2012 | Pagaila | |
| 2012/0268899 A1 | 10/2012 | Haba et al. | |
| 2012/0326271 A1 * | 12/2012 | Teh | ..................... H01L 23/3121 257/532 |
| 2013/0036829 A1 | 2/2013 | Van Steenberge | |
| 2013/0056867 A1 | 3/2013 | Pagaila et al. | |
| 2014/0291001 A1 * | 10/2014 | Lin | ..................... H01L 23/3121 174/261 |
| 2015/0162218 A1 | 6/2015 | Cheung | |
| 2015/0228508 A1 | 8/2015 | Whiting et al. | |
| 2017/0048986 A1 * | 2/2017 | Mei | ........................ H01L 21/568 |
| 2017/0171958 A1 * | 6/2017 | Ng | ........................ H05K 1/028 |

OTHER PUBLICATIONS

Xie et al., "Heterogeneous Integration of Bio-Sensing System-on-Chip and Printed Electronics", IEEE Journal on Emerging and Selected Topics in Circuits and Systems (JETCAS), vol. 2, No. 4, pp. 672,682, Dec. 2012.
EP Search Report dated Nov. 9, 2017—Application No. 16202082.0 (18 pgs).

* cited by examiner

BARE DIE INTEGRATION WITH PRINTED COMPONENTS ON FLEXIBLE SUBSTRATE

REFERENCE TO RELATED APPLICATION

Under 35 U.S.C. § 119, this application claims priority to, and the benefit of, U.S. provisional patent application Ser. No. 62/204,706, entitled "BARE DIE INTEGRATION WITH PRINTED COMPONENTS ON FLEXIBLE SUBSTRATE", and filed on Aug. 13, 2015, the entirety of which is hereby incorporated by reference.

BACKGROUND

The present application is directed to electronic fabrication and more particularly fabrication of hybrid electronic platforms, which are comprised of different types of components such as integrated circuits and discrete components located on a common substrate. Hybrid electronic platforms employ cost-effective, large-area manufacturing techniques while keeping the same complex functionality and processing capability as silicon-based systems. Due to temperature and mechanical reasons, traditional silicon integration methods, such as solder bonding and wire bonding may not be suitable for hybrid platforms which may include flexible printed electronics. Various packaging techniques have been developed for chip integration on flexible substrates. For example, anisotropic conductive film (ACF) can be applied to bond and connect a chip to a circuit on a plastic substrate. However, a downside of this method is the limitation of the minimal size of the contact pads on the chip which can be bond with the adhesive.

It is considered useful to provide techniques which overcome the noted limitations and others.

BRIEF DESCRIPTION

Provided is a manufacturing process for electronic circuit components such as bare dies, and packaged integrated chips, among others, where the surface of the electronic circuit component is at the same level as the associated substrate. The surface of the electronic circuit component carries electronic elements including contact pads. A gap exists between the electronic circuit component, and the end of an opening within the substrate. This gap is filled with a filler material, such as a bonding material. The bonding material also used to encapsulate or bond together the substrate and electronic circuit component. During the manufacturing process, the front surface of the electronic circuit component, which carries electronic elements including contact pads, and the front surface of the substrate, which also carries various electronic elements, are held in an adhesive relationship by a flat material having an upper surface which includes adhesive, tacky or sticky material (such as PDMS). Once the flat material is separated and removed the planar flat or level upper surface can readily accept the formation of conductive traces by the use of inkjet printing or other technologies.

DETAILED DESCRIPTION

In the following discussion the use of the term "electronic circuit component(s)" is to be understood to include any of a number of electronic circuit configurations including but not limited to bare die, electronic packaged electronic chips, among others.

In order to provide a manufacturing process for electronic circuit component integration on a flexible substrate, the present discussion discloses a method and structure to facilitate high resolution connection with a printing process. In the, to be disclosed structure, a surface of the electronic circuit component, which carries electronic elements including contact pads and other electronic circuitry, is at the same level as the substrate. Around the side wall of the electronic circuit component there is a filler material used to bridge the component and the substrate. The top surface of the filler is also in line or substantially level with the substrate and the electronic circuit component top surface, which holds contact pads and other electronic circuitry. This arrangement permits high resolution patterning to be readily performed to construct or lay down conductive traces or connections between the circuitry on the component and circuitry on the substrate.

To meet the challenge of the complexity of packaging, one embodiment employs a jet based printing technology, such as one commonly referred to as inkjet printing which offers capabilities to enable high density and low resistance interconnections, and may in some embodiments be a three-dimensional (3D) type printing. With use of inkjet type technology, standard wire bonding processes can be replaced when the interconnections are made of printed conductive (such as metal) lines on a flat, planar, level area. Thus the material being printed is understood to be a printable conductive material.

Figure 1:
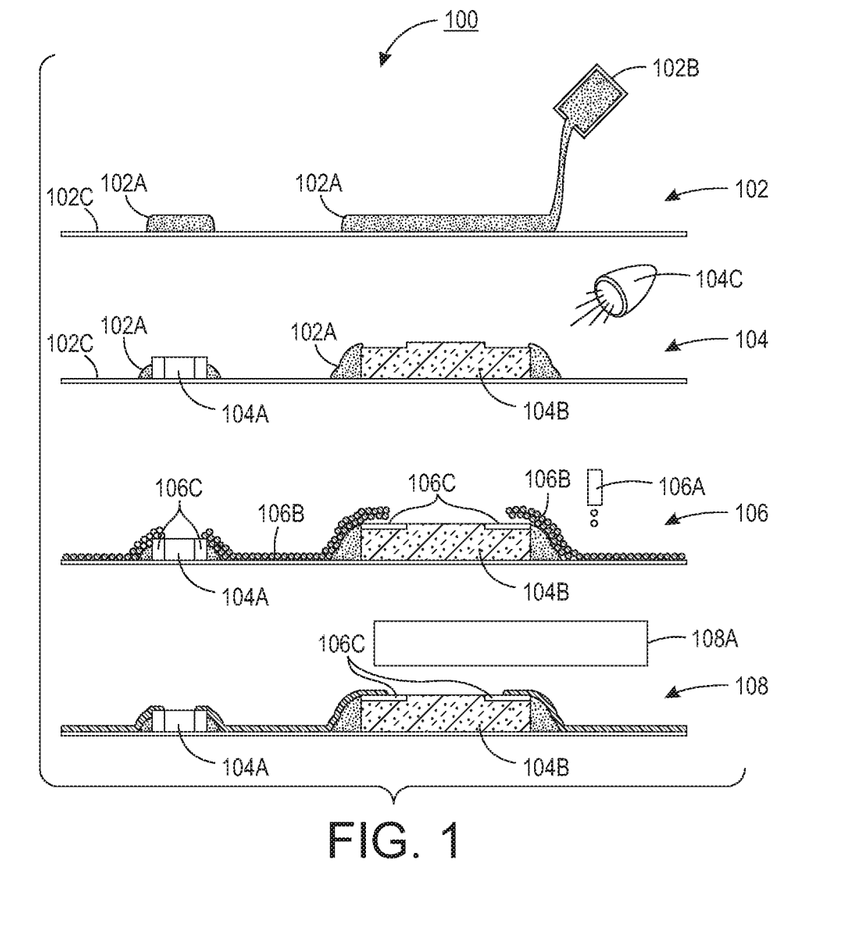
FIG. 1 illustrates a process for providing interconnects wherein a ramp is built around the components to be associated.

Turning to FIG. 1 illustrated is a known assembly process 100, represented by a series of schematic diagrams 102-108, which employs inkjet printing. The process 100 includes:

As shown in a first step illustrated by diagram 102, a non-conductive adhesive 102A is dispensed by a dispensing device 102B onto an upper surface of a substrate 102C. The non-conductive adhesive being in a semi-soft state.

Next in a second step illustrated by diagram 104, electronic components 104A and 104B are placed at appropriate locations on the surface of the substrate 102C such that they are in contact with the non-conductive adhesive 102A, and may be pressed into the non-conductive material such that the non-conductive material rises up around the components 104A, 104B. The components are placed with their contact connections in an up position (i.e., the connection portions of the components 104A, 104B are not in contact with the non-conductive adhesive). At this point a curing operation is undertaken to cure the non-conductive adhesive. The curing can be accomplished in a number of known ways such as but not limited to use of a curing lamp 104C.

Turning to a third step illustrated by diagram 106 an inkjet type printer 106A is used to inkjet print circuit patterns as well as interconnections 106B, which connect to contact areas (e.g., pads) 106C of the components 104A, 104B.

Finally, in a fourth step illustrated by diagram 108 a sintering element 108A is provided and used to sinter the printed conductive material.

A particular concept of the steps illustrated by diagrams 104 and 106 are that they utilize non-conductive adhesive to form a ramp to seal the side wall of a the components 104A, 104B (which may be a resistor, bare die, etc.) and provide a supporting surface for printed conductive trace to connect contact pads on the components of a circuit which is printed on substrate 102C.

Figure 2:
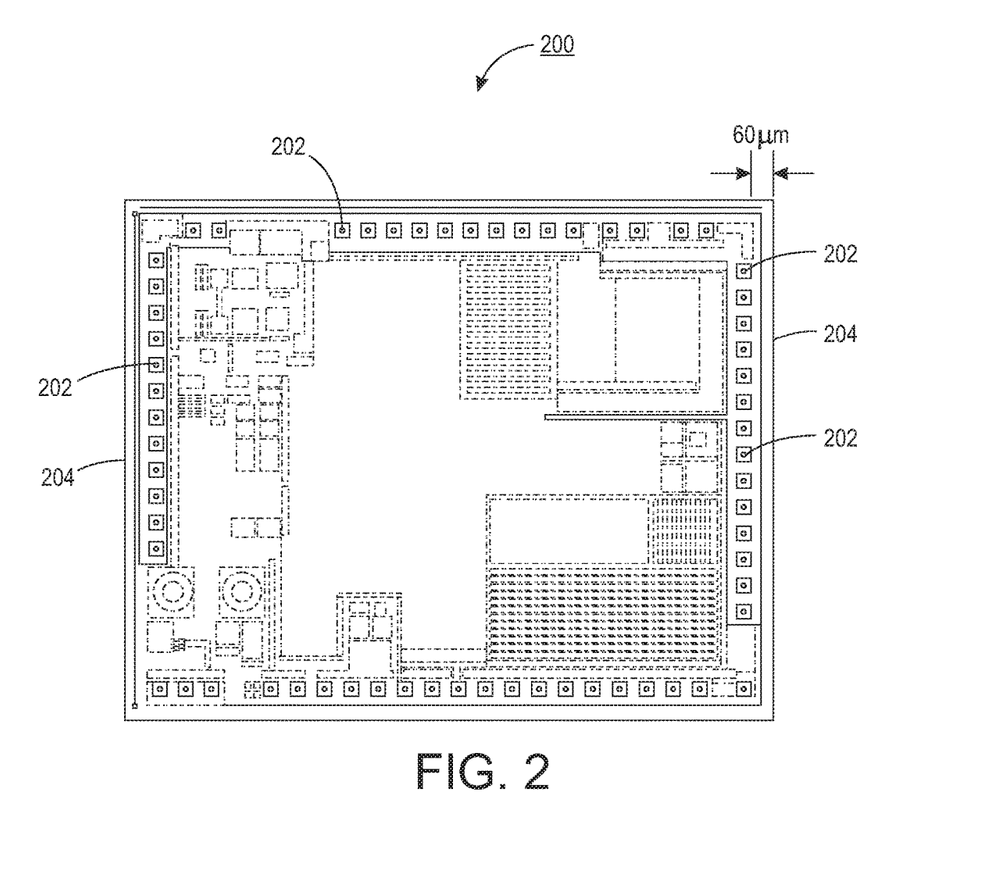
FIG. 2 depicts a chip that may implement the concepts of the present application.

FIG. 2 shows an exemplary bare die 200, which has 36 contact pads 202 (not all pads numbered) with the smallest pitch about 120 um and the spacing between the pads to the edge 204 of the bare die is about 60 um. In practice, it is difficult to construct the ramp of FIG. 1 to seal the side wall of the die without covering the contact pads of the chip or die.

In order to provide a manufacturing process for electronic circuit component integration (including bare die, packaged chips, etc.) on a flexible, substrate, the inventors have developed a method and structure to facilitate high resolution connection with appropriate printing processes. In the disclosed structure, the surface of the electronic circuit component is at substantially the same level as the substrate. Around the side wall of the electronic circuit component, there is a filler to bridge a gap between the electronic circuit component and the substrate. The top surface of the filler is also in line or substantially level or planar with the substrate surface. Therefore, high resolution patterning can be readily performed to construct conductive connections between the electronic circuit component and the circuit on the substrate, without the need of a ramp as used in the process of FIG. 1 (i.e., the following discuses a ramp-less solution).

Figure 3:
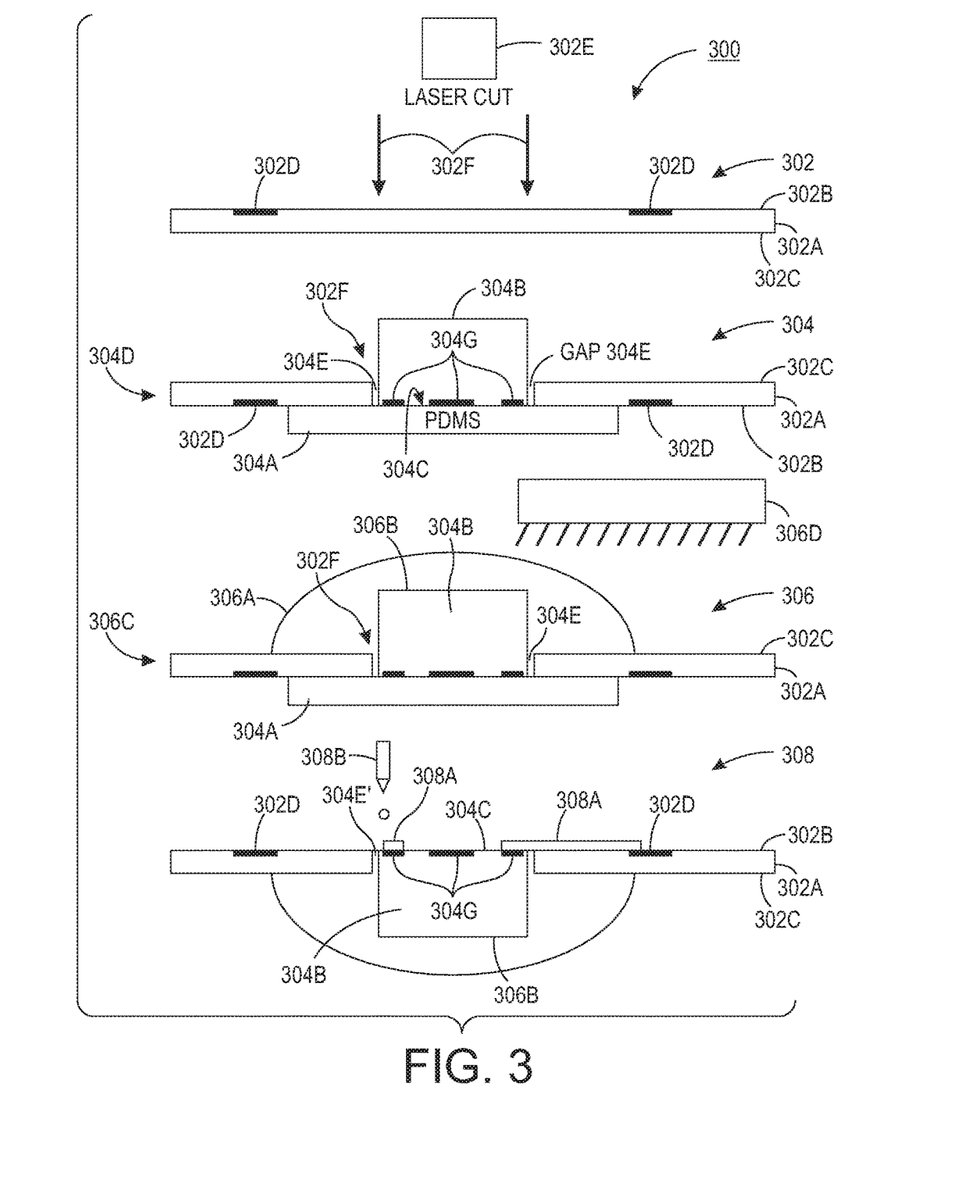
FIG. 3 illustrates a process according to the present application where interconnections are made in a system where no ramp is required.

Turning to FIG. 3 illustrated are processing steps 300 according to the present application to construct a hybrid electronics platform assembly, also shown in FIG. 3 (i.e., diagram 308).

As illustrated in diagram 302, a substrate 302A is provided (in some embodiments the substrate is a flexible substrate, such as a plastic substrate). Substrate 302A has a first surface 302B and second surface 302C opposite the first surface. These surfaces define the height of the substrate 302A. The first surface 302B may include electronic circuitry 302D such as but not limited to conductive circuit tracings. Also, while shown in side view, it is understood substrate 302A of course also has width and length dimensions.

A material removal device 302E forms an opening 302F (the opening 302F defined by the parallel downward facing arrow lines) within a pre-identified location of substrate 302A. More particularly at least one location on the first surface 302B of the substrate 302A appropriate to form the opening through the substrate is identified. Thereafter, the material removal device 302E performs a material removal operation to create the opening 302F in the substrate 302A, where the opening 302F is positioned within length and width boundaries of the substrate 302A, and the opening extends through the first surface 302B and the second surface 302C.

The material removal device 302E is in one embodiment a laser arrangement, while in another embodiment it is a physical contact cutting device. In further embodiments other devices capable of precisely removing material to form opening 302F may be used. It is also to be understood that multiple openings may be made in a single substrate, and the assembly process of FIG. 3 may be repeated a plurality of times for that same substrate, such that multiple openings are formed.

The opening 302F is made to conform to the shape and dimensions of a particular electronic circuit component (e.g., a bare die) being incorporated. However, a certain amount of clearance (e.g., about 5-25 μm) is provided to ensure the electronic circuit component 304B is capable of being received. The electric circuit component 304B is at least one of a bare die or pre-packaged electronic circuit component.

In a next step shown by diagram 304, opening 302F is more clearly depicted. It is mentioned here that diagram 304 is a modified side view, and for ease of understanding substrate material for example in front of electronic circuit component 304B is not shown. However it is to be understood that as the location of the electronic circuit component 304B is within the boundaries of the substrate 302A, there would be portions of the substrate in front of the electronic circuit component 304B, which would obstruct the view of a gap 304E, as well as the lower portion of the electronic circuit component 304B.

In diagram 304 the substrate 302A has been turned over such that first surface 302B (with circuits/traces 302D) is now facing downward. Additionally, a flat article with a tacky upper surface (e.g., a polydimethyisiloxane (PDMS) material, or other elastomer polymer which holds elements but does not permanently bond the elements together) 304A, is positioned over the opening 302F, and at least a portion of the first surface 302B of substrate 302A. The electronic circuit component 304B with its front surface 304C facing downward is then placed in the opening 302F. It is mentioned front surface 304C includes conductive circuit traces (including contact pads) 304G.

The upper face of the flat article with the tacky surface 304A may be considered an alignment area 304D where the first surface 302B of substrate 302A and the first surface 304C of the electronic circuit component 304B are aligned in a substantially planar or flat or level relationship due to the flat article 304A.

Also shown in diagram 304 is gap 304E which exists between the end of opening 302F and electronic circuit component 304B. The gap 304E is preferred to not be overly large, but sufficient to not interfere with the placement of the electronic circuit component 304B (e.g., about 5-25 μm).

Turning to diagram 306 of FIG. 3, a bonding material 306A is applied on and over the second surface (backside) 306B of the electronic circuit component 304B, and on and over at least some portions of the second surface 302C of the substrate 302A. This backside area may be understood to be a non-alignment area 306C where the second surface 302C of the substrate 302A and the second surface 306B of the electronic circuit component 304B are not aligned. In other words the height of the electronic circuit component 304B is greater than the height of the substrate.

In one embodiment the bonding material 306A is a UV curable polymer dispensed onto the backside of the arrangement, the bonding material acting to seal the gap 304E. A curing arrangement (which may include curing lamps, heaters and/or other appropriate components) 306D is provided to perform curing on the UV curable polymer. After UV curing, the UV cured polymer provides a bonding structure for the assembly. Of course, other bonding materials known in the art may also be employed in place of the UV bonding material.

In diagram 308 of FIG. 3, the assembly has been turned over and the flat article (e.g., PDMS material) 304A is separated and removed, exposing a substantially flat or planar or level surface spanning from the first surface 302B, across the filled in gap 304E' (i.e., filled in with the bonding material 306A to form a flat or planar surface), and further across the first surface 304D. It is mentioned the selected adhesive material includes the characteristics of holding the mentioned components, but when separated does not leave behind undesirable amounts of residue that would otherwise interfere with the additional assembly process. Also, as an optional step, a cleaning of the component and substrate surfaces could be undertaken following separation and removal. By the noted operations the ramp formed by the process in FIG. 1 is eliminated.

Finally, conductive traces 308A, extending between the first surface 302B of substrate 302A and the first surface 304D electronic circuit components 304B are formed or laid down (e.g., the laying down being accomplished in a rampless structure.). In one embodiment traces 308A are generated by use of an inkjet type printing device 308B (using a conductive fluid). In an alternative embodiment the traces may be formed by use of photolithography, which requires a flat or planar or level surface to form conductive traces.

With continuing attention to the processing steps 302-308 of FIG. FIG. 3, while described are embodiments which show laser cutting (302F) being performed on a prefabricated circuit board (e.g., substrate 302A), this order of processing can be altered. For example, laser cutting could be to a blank substrate and a bonding of the circuit component 304B, then further a printing of a circuit with the connection path.

Figure 4A:
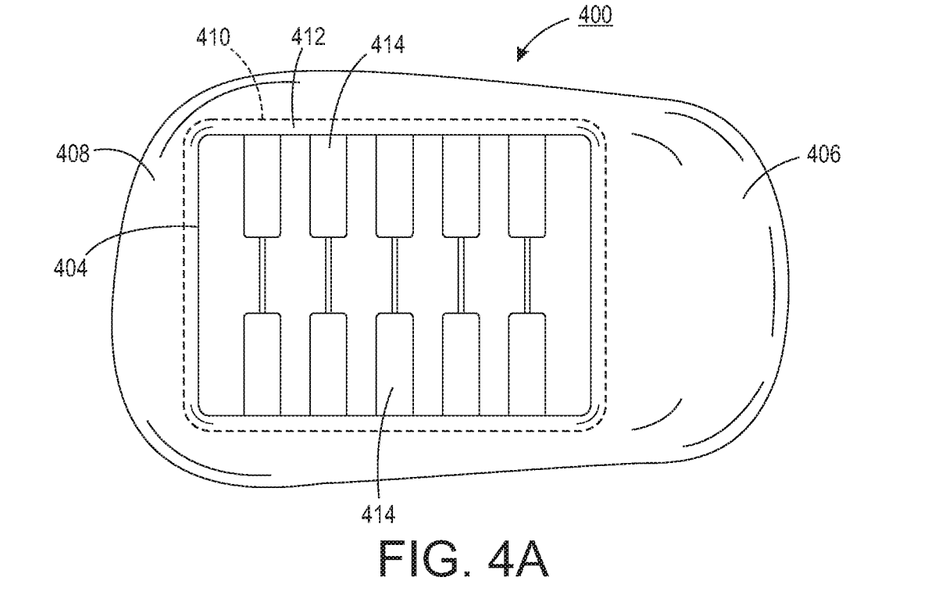
FIGS. 4A and 4B illustrate top and perspective views of a prototype of an assembled silicone (SI) test die assembly.
Figure 4B:
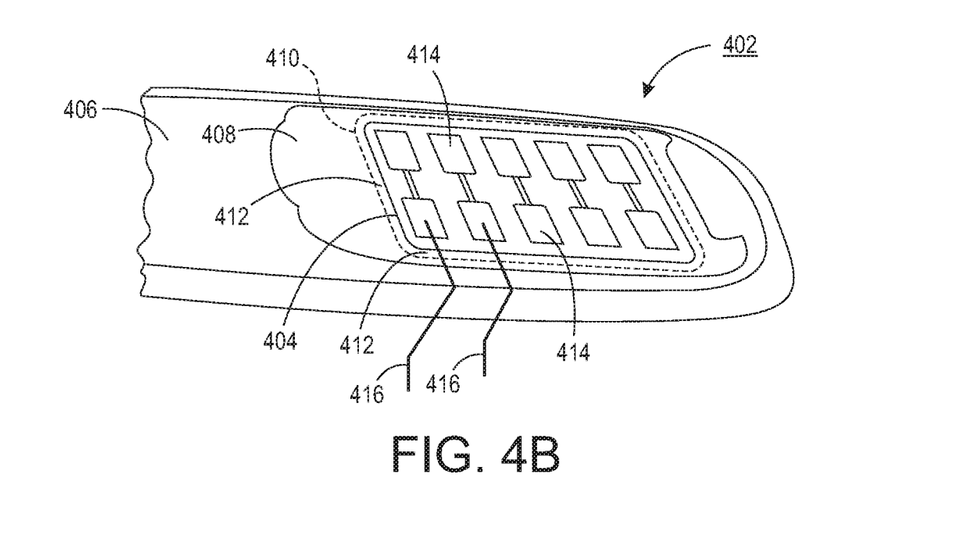

Turning to FIGS. 4A and 4B, illustrated is a top view 400 and a perspective view 402 of a silicone (Si) bare die assembly prototype. In accordance with teachings of the present application, the size of the test die 404 is approximately 4×6 mm. Substrate 406 is an approximately 120 µm thick polyethylene naphthalene (PEN) sheet. For the prototype, a bonding material (Norland Products Inc. 83H adhesive) 408 was used.

A cutting contour 410 is provided along the exterior area of the bare die 404. Gap 412 defines the area between the bare die 404 and the substrate cut contour 410. Also shown in this figure are contact pads 414 located on the Si bare die 404 (only certain contact pads 414 are numbered for clarity of the figure). In addition, printed connection traces 416 are shown extending off of the assembly, which causes them to pass over contact pads 414 and gap 412 (only a limited number of the printed connection traces 416 are shown and numbered for clarity of the drawing).

It is to be appreciated that bonding material 408 is on the opposite side of substrate 406 and is visible through the substrate 406, as in this prototype the substrate 406 is transparent.

Figure 5:
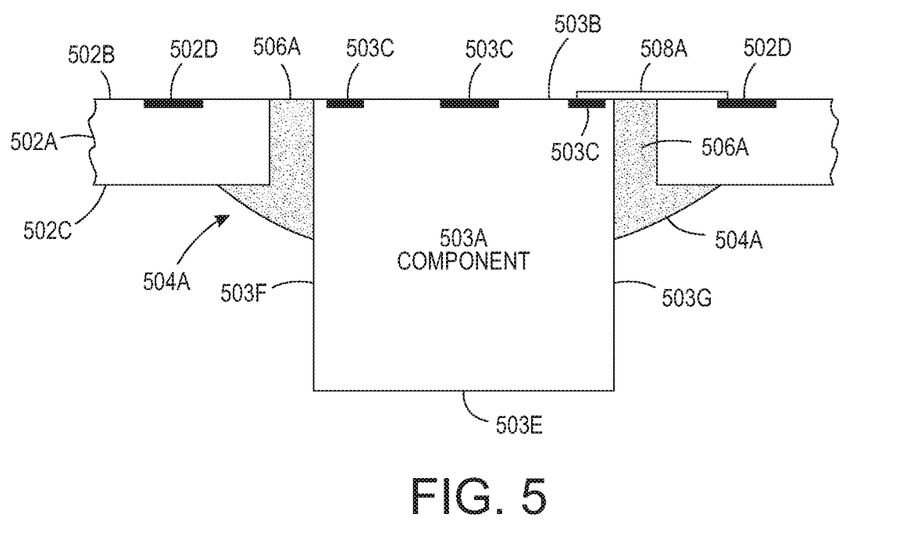
FIG. 5 depicts an alternative embodiment of a structure formed in accordance with the teachings of FIG. 3.

FIG. 5 depicts an alternative embodiment of a structure formed in compliance with the general teachings of FIG. 3.

Side view 500 of FIG. 5 includes substrate 502A, with an upper substrate surface 502B and a lower substrate surface 502C. Electronic circuitry 502D, such as but not limited to conductive circuit tracings is carried on upper surface 502B. In this embodiment, the electronic circuitry component 503A includes an upper surface 503B, carrying electronic circuitry 503C including but not limited to contact pads. Component 503A further includes a backside surface 503E and sidewalls 503F and 503G. Conductive trace 508A extends between electronic circuit component 503A and substrate 502A, while crossing a filled gap 506A. Conductive trace 508A being formed by printing techniques such as inkjet type printing (using a conductive material), photolithography or other known techniques.

In this embodiment of FIG. 5, a particular distinction is that bonding material 504A is applied in a less liberal manner than previous embodiments (i.e., see diagram 306 and bonding material 306A of FIG. 3). Particularly, bonding material (which in this view has been cured) 504A is applied to fill gap 506A and extends past the gap 504A along the sidewalls 503F and 503G of the electronic circuit component 503A, as well as to a portion along the sidewalls of the substrate 502A and to a small portion of the backside surface 502C of the substrate 502A. Thus, this embodiment provides a more compact, less material intensive assembly.

In another embodiment the process disclosed in relation to FIG. 3 (and FIG. 5) may be applied in retrofitting operations. For example, in these situations the substrate is a prefabricated circuit board having circuits and electronic circuit components (such as 304B, 503A). In this situation the process further includes retrofitting the prefabricated circuit board by at least adding an additional electronic circuit component(s) to the circuit board and/or replacing existing electronic circuit components on the prefabricated circuit board. In each case performing such retrofitting in accordance with the teachings of FIGS. 3 and 5.

Figure 6A:
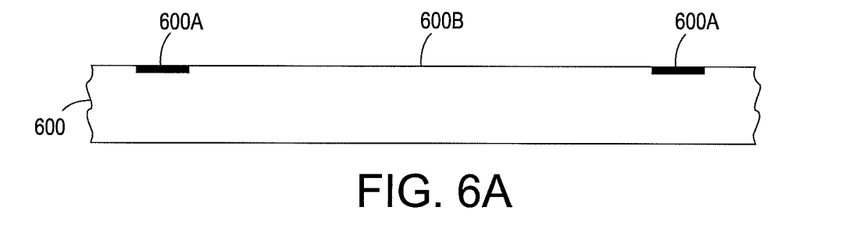
FIGS. 6A and 6B illustrate a substrate and an electronic circuit component which may be used in connection with the present teachings.
Figure 6B:
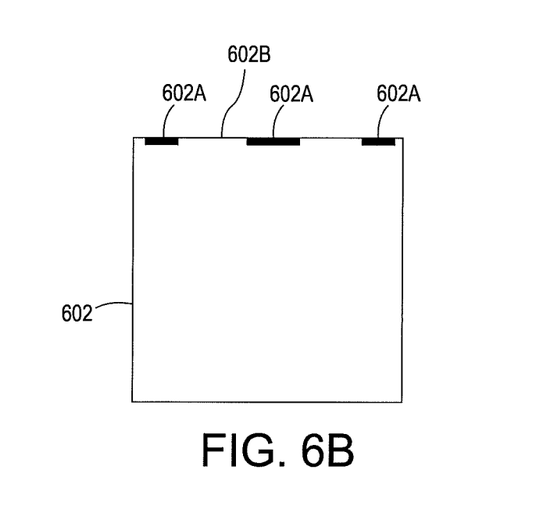

Turning now to FIGS. 6A and 6B, in the foregoing embodiments, the respective electronic circuitry is substantially level with a surface of the respective substrates. However, it is to be understood the present concepts are useful also when the electronic circuitry and substrates are not flush. For example, in FIGS. 6A and 6B, illustrated is a substrate 600 and an electronic circuit component 602. As can be seen, the electronic circuitry or traces 600A on substrate 600, and electronic circuitry or traces 602A on electronic component 602, rise in profile above the respective surfaces 600B, 602B. In certain embodiments, the profile is from substantially 1-20 microns, and more particularly, is in the range of 10-20 microns above the surface. It is to be appreciated therefore that the processes described in the foregoing figures for a laser cut type assembly are appropriate for the items such as shown in FIGS. 6A and 6B, as well as those shown in the foregoing figures, and the same types of processes will be used. It is to be mentioned that, for example, when the electronic circuitry component is placed in contact with a material (for example, PDMS) which is sufficiently soft, this allows the electronic circuitry component to push into the PDMS material providing it with appropriate positioning for the remainder of the process to be undertaken.

Similarly, when a conductive trace on a substrate is applied to elements such as those of 600 and 602, there is sufficient depositing height to generate a substantially flat circuitry line such as shown in the preceding figures.

The preceding discussion has described a method of forming a hybrid electronic assembly. The method is noted to include the steps of providing a substrate having a first surface and second surface opposite the first surface, the first surface including conductive circuit tracings, the substrate having height, width, and length dimensions. At least one location is identified on the first surface of the substrate to form at least one opening through the substrate. A material removal operation is performed at the identified at least one location, to create the at least one opening in the substrate at the at least one identified location. An article with an adhesive surface is attached on a first flat or planar side over the at least one opening and the at least part of the substrate on the first surface side of the substrate. An electronic circuit component is placed into the at least one opening at an orientation which has the first surface of the electronic circuit component pass into the opening until the first surface of the electronic circuit component engages with the elastomer material covering the opening at substantially the second surface of the substrate, wherein both the first surface of the electronic circuit component and the first surface of the substrate are placed in a substantially planar or flat or level relationship. A bonding material is applied to physically associate at least a portion of the electronic circuit component and at least a portion of the second surface of the substrate. A curing operation is performed to cure the bonding material, thereby providing a secure physical connection between the substrate and the electronic circuit component. The article with the tacky surface on a first flat or planar side is separated from the first surface of the electronic circuit component and the first surface of the substrate. Thereafter, conductive traces are laid down between the substrate and the electronic circuit component thereby providing electrical connections.

Aspects of the above described method are set forth below.

The laying down is accomplished in a ramp-less structure.

The first surface of the electronic circuit component and the first surface of the substrate includes being sufficiently level to allow the conductive traces to be formed.

The substrate is a prefabricated circuit board, and the methods described further include retrofitting the prefabricated circuit board by at least one of adding additional electronic circuit components and replacing existing electronic circuit components on the prefabricated circuit board.

The electronic circuit component is at least one of a bare die, and a prepackaged electronic circuit component.

The laying down of conductive traces includes performing at least of inkjet printing, photolithography, and three-dimensional printing.

The material removal operation is performed by one of laser cutting, melting operations, and physical contact cutting operations.

The bonding material is in one embodiment a UV curable polymer material.

The substrate is a plastic substrate.

The substrate is a flexible substrate.

The article with a tacky surface is a flat PDMS material, or elastomer material.

The described steps form a hybrid electronic assembly which includes a substrate having a first surface and second surface opposite the first surface, which defines the height of the substrate, the first surface includes conductive circuit tracings, the substrate further including at least one opening defined within length and width dimensions of the substrate, the opening extending through the first surface and the second surface, and an electronic circuit component having a first surface and a second surface, the first surface having conductive circuit tracings, the electronic circuit component located within the at least one opening of the substrate, having height, width, and length dimensions sufficient to fit into or through the at least one opening in the substrate. An alignment area is provided where the first surface of the substrate and the first surface of the electronic circuit component are aligned in a substantially planar flat relationship with the electronic circuit component located within the at least one opening in the substrate. A non-alignment area is provided where the second surface of the substrate and the second surface of the electronic circuit component are in a non-aligned relationship, wherein the height of the electronic circuit component is greater than the height of the substrate and with the electronic circuit component located within the at least one opening the second surface of the electronic circuit component extends past the second surface of the substrate. A bonding material is formed on at least a portion of the second surface of the substrate and at least a portion of the electronic circuit component, the connection material encompassing sufficient portions of the substrate and the electronic circuit component to maintain the substrate and the electronic circuit component in a physically secure connection. Conductive traces are formed between the first surface of the substrate and the first surface of the electronic circuit component, providing electrical connections between the substrate and the electronic circuit component.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A hybrid electronic assembly comprising:
   a substrate having a first surface and second surface opposite the first surface, which defines the height of the substrate, the first surface including conductive circuit tracings, the substrate further including at least one opening defined within length and width dimensions of the substrate, the at least one opening extending through the first surface and the second surface;
   an electronic circuit component having a first surface and a second surface, the first surface having conductive circuit tracings, the electronic circuit component located within the at least one opening of the substrate, having height, width, and length dimensions sufficient to fit into or through the at least one opening in the substrate;
   an alignment area where the first surface of the substrate and the first surface of the electronic circuit component are aligned in a substantially planar flat relationship with the electronic circuit component located within the at least one opening in the substrate;
   a non-alignment area where the second surface of the substrate and the second surface of the electronic circuit component are in a non-aligned relationship, wherein the height of the electronic circuit component is greater than the height of the substrate and with the electronic circuit component located within the at least one opening the second surface of the electronic circuit component extends past the second surface of the substrate;
   a bonding material formed on at least a portion of the second surface of the substrate and on at least a portion of the electronic circuit component, the bonding material encompassing sufficient portions of the substrate and the electronic circuit component to maintain the substrate and the electronic circuit component in a physically secure connection; and
   conductive traces formed between the first surface of the substrate and the first surface of the electronic circuit component, providing electrical connections between the substrate and the electronic circuit component.

2. The assembly according to claim 1 wherein the conductive traces are formed on a ramp-less structure.

3. The assembly according to claim 1 wherein substantially planar or flat or level with the first surface of the electronic circuit component and the first surface of the substrate includes being sufficiently level to allow the conductive traces to be formed.

4. The assembly according to claim 1 wherein the substrate is a prefabricated circuit board, and the assembly is a retrofit assembly which includes additional electronic circuit components to the prefabricated circuit board.

5. The assembly according to claim 1 wherein the electronic circuit component is at least one of a bare die, and a prepackaged electronic circuit component.

6. The assembly according to claim 1 wherein the at least one opening in the substrate is one of laser cut material opening, melted material opening, and physical contact cut material opening.

7. The assembly of claim 1, wherein a gap or clearance of between 5 µm to 25 µm exists between the electronic circuit component and the opening.

8. The assembly of claim 1, wherein the bonding material covers less than the entire substrate.

9. The assembly of claim 1, wherein the bonding material covers less than the height of the electronic circuit component.

10. The assembly of claim 1, wherein the electronic circuitry or traces rise in profile in a range of 10-20 microns.

11. A hybrid electronic assembly comprising:
a substrate having a first surface and second surface opposite the first surface, which defines the height of the substrate, the first surface including conductive circuit tracings, the substrate further including at least one opening defined within length and width dimensions of the substrate, the at least one opening extending through the first surface and the second surface;
an electronic circuit component having a first surface and a second surface, the first surface having conductive circuit tracings, the electronic circuit component located within the at least one opening of the substrate, having height, width, and length dimensions sufficient to fit into or through the at least one opening in the substrate;
an alignment area where the first surface of the substrate and the first surface of the electronic circuit component are aligned in a substantially planar flat relationship with the electronic circuit component located within the at least one opening in the substrate;
a non-alignment area where the second surface of the substrate and the second surface of the electronic circuit component are in a non-aligned relationship, wherein the height of the electronic circuit component is greater than the height of the substrate and with the electronic circuit component located within the at least one opening the second surface of the electronic circuit component extends past the second surface of the substrate;
a bonding material formed on at least a portion of the second surface of the substrate and on at least a portion of the electronic circuit component, the bonding material encompassing sufficient portions of the substrate and the electronic circuit component to maintain the substrate and the electronic circuit component in a physically secure connection; and
conductive traces formed between the first surface of the substrate and the first surface of the electronic circuit component, providing electrical connections between the substrate and the electronic circuit component,
wherein the conductive traces are at least one of inkjet printed conductive traces, photolithographic conductive traces, and three-dimensional printed conductive traces.

* * * * *